MICROWAVE FREQUENCY MULTIPLIER USING A NON-LINEAR REACTANCE

Filed May 12, 1964 2 Sheets-Sheet 1

INVENTOR.
John P. Parker
BY Mueller & Aichele
Attys.

INVENTOR
John P. Parker
By Mueller & Aichele
Attys.

United States Patent Office
3,328,670
Patented June 27, 1967

3,328,670
MICROWAVE FREQUENCY MULTIPLIER USING A NON-LINEAR REACTANCE

John P. Parker, Scottsdale, Ariz., assignor to Motorola, Inc., Franklin Park, Ill., a corporation of Illinois

Filed May 12, 1964 Ser. No. 366,799
7 Claims. (Cl. 321—69)

This invention relates to frequency multipliers and in particular to a frequency multiplier incorporating a variable capacitance varactor diode.

A frequency multiplier circuit which uses a varactor diode as the harmonic generator requires, for optimum efficiency, that the fundamental frequency be prevented from dissipating energy in the load, and that the output frequency be prevented from dissipating energy in the source impedance. In addition, to achieve the highest efficiency in varactor multiplier circuits which multiply by integers greater than two, it is necessary to incorporate idler frequency circuits which permit harmonic frequencies other than the fundamental and output harmonic frequencies to flow through the varactor diode without dissipating energy in either the load or the source impedance.

It is, therefore, an object of this invention to provide a simple and efficient frequency multiplier circuit utilizing a varactor diode wherein the input, output and idler frequency currents each flow through the varactor diode with a minimum of dissipation of energy.

Another object of this invention is to provide a frequency multiplier circuit utilizing a varactor diode for the generation of harmonic frequencies of a fundamental frequency signal applied thereto in which the harmonic frequency signals are isolated from the source of the fundamental frequency signal and only the desired output harmonic frequency signal is coupled to a load.

Another object of this invention is to provide a frequency multiplier circuit utilizing a varactor diode for the generation of harmonic frequencies of fundamental frequency signal applied thereto which includes circuit paths for the circulation of desired harmonic frequency signals.

A feature of this invention is the provision of a frequency multiplier structure including a varactor diode for generating harmonics of a fundamental frequency signal applied thereto and including a compound transmission line section coupling the fundamental frequency signal to the diode and being responsive to the harmonic frequencies, to isolate the source of the fundamental frequency signal from the harmonic frequencies generated by the diode and to provide a path for the circulation of idler frequency currents.

Another feature of this invention is the provision of a frequency multiplier structure including a varactor diode for generating harmonics of a fundamental frequency signal applied thereto and including a compound transmission line coupling the fundamental frequency signal to the diode and being responsive to the harmonic frequencies to couple a portion of the frequencies to the source of the fundamental frequency signal and the multiplier structure and means in the input transformer to provide a shunt path for the circulation of harmonic frequency signals coupled thereto by the compound transmission line. This path in cooperation with the input transformer prevents the flow of harmonic frequency signals in the source resistance.

A further feature of this invention is the provision of a frequency multiplier structure including a varactor diode for generating harmonics of a fundamental frequency signal applied thereto and including a stub tuner coupled to the diode to provide a path for the circulation of idler currents. The stub tuner may be either of the short circuited type or of the open circuited type, each of which provides a variable electrical length.

Another feature of this invention is the provision of a frequency multiplier structure including a varactor diode for generating harmonics of a fundamental frequency signal applied thereto and including an output filter, coupled to the diode by a transmission line, for rejecting all frequencies except the desired output harmonic frequency. The length of the transmission line is adjusted to provide idler circuits at the desired frequencies employing the filter (which is a reflective termination at all important harmonic frequencies except the desired output frequency), the diode, and the line lengths between the diode and the filter.

The invention is illustrated in the drawings wherein.

In practicing this invention a transmission line structure capable of propagating the TEM mode is used. A varactor diode is coupled between the center conductor and the outer conductor of a first transmission line. An input signal at a fundamental frequency is coupled to the diode through a compound transmission line and the first transmission line, thus generating harmonics of the fundamental frequency. A compound transmission line section consists of two or more sections of transmission line connected together with each section having a different characteristic impedance. In this invention the compound transmission line is formed with a cylindrical sleeve in combination with a coaxial transmission line assembled in a fashion to produce two lengths of transmission lines one of which is folded about the other with the two lengths of transmission lines having different characteristic impedances. The compound transmission line section and a stub tuner are incorporated in the structure to provide paths for the circulation of the idler currents through the varactor diode. The section of compound transmission line also provides isolation between the source and the harmonic frequencies generated by the diode. The load is coupled to the first transmission line by a second transmission line and a filter which will pass only the output harmonic frequency, thus isolating the load from the input and idler frequency currents. The output filter provides a termination for the transmission lines coupling it to the diode whereby a path is provided for the circulation of an idler frequency current. The compound transmission line can be adjusted to allow a portion of the idler harmonic frequencies to be coupled to the input transformer. A shunt path is then provided by the input transformer to allow circulation of these idler frequency currents between the diode and the input transformer while at the same time isolating the idler frequency currents from the source resistance.

Figures 1, 2, 3:
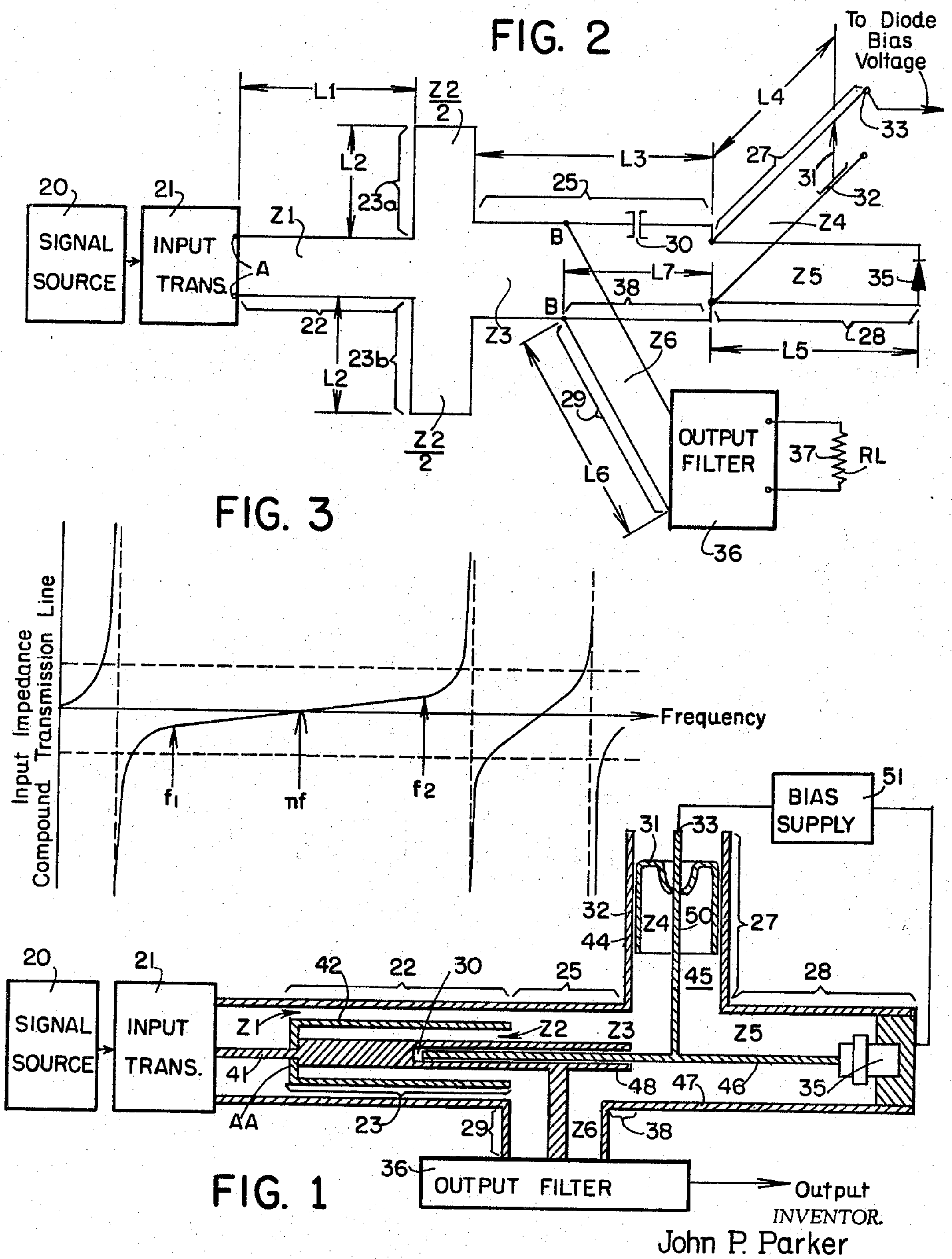
FIG. 1 is a cross-sectional drawing of the structure incorporating the features of the invention.
FIG. 2 is a schematic diagram of a circuit illustrated in FIG. 1.
FIG. 3 is a curve showing the variation of the input impedance of a compound transmission line as a function of frequency.

A frequency multiplier incorporating the features of this invention is shown in FIG. 1. The schematic representation of the structure shown in FIG. 1 is illustrated in FIG. 2. Corresponding parts of the structure and the schematic representation thereof have the same identification numerals.

An alternating current signal from a source 20 is coupled to the multiplier circuit by input transformer 21, input transformer 21 provides the necessary tuning and impedance transformation to deliver maximum power to the varactor diode 35 at the frequency of the signal source. The input transformer 21 is coupled to varactor diode 35 by means of a transmission line which incorporates compound transmission line sections 22 and 23. A cylindrical conductor 42, having one end connected to the center conductor 41, acts as the center conductor of compound transmission line section 22 and the outer conductor of compound transmission line section 23. This structure forms the compound transmission line in which the line section 22 has an impedance Z1 and length L1 and the line section 23 has an impedance Z2 and length L2. Section 23 of the compound transmission line is shown schematically in FIG. 2 as sections 23*a* and 23*b* each having an impedance Z2/2.

The compound transmission line section is coupled to the varactor diode by a first transmission line section consisting of a center conductor 46 and an outer conductor 47. The first transmission line section is shown schematically in FIG. 2 as transmission line section 25, having an impedance Z3 and a length L3, and transmission line section 28, having an impedance Z5 and length L5. A gap 30 is provided in the center conductor of the first transmission line section 25 to prevent the flow of direct current (diode bias) to the remainder of the frequency multiplier. This direct current block is formed by folding a portion of center conductor 41 over center conductor 46 and insulating the two center conductors by a thin dielectric sleeve 48.

The output load 37 is coupled to the first transmission line section 25 by a second transmission line section 29, of impedance Z6 and length L6, and output filter 36. Transmission line section 38 is the portion of first transmission line section 25 between transmission line sections 28 and 29 and has a length L7. The output filter 36 rejects all important harmonic frequencies of the fundamental frequency signal applied to the frequency multiplier except the desired output frequency.

A transmission line section 27, of length L4 and impedance Z4, forming a shorting stub is coupled to the transmission line at the junction of transmission line sections 25 and 28. A plunger 31 provides a low impedance path, for the alternating current frequencies present in the multipliers, between the center conductor of the shorting stub 50 and the outer conductor 44. A gap 32 between the plunger 31 and the outer conductor 44 prevents the diode bias supply current from being shorted from the inner to the outer conductor of the shorting stub at this point. The bias supply 51 provides direct current bias for the varactor diode and is coupled to the center conductor of the shorting stub at point 33. The bias current flows through the center conductors of the shorting stub 50 and transmission line 46 to varactor diode 35 and returns to the bias supply from the outer conductor 47 of the transmission line. The gaps 30 and 32 in the transmission line structure present a very low impedance to the frequencies used in the multiplier. By varying the bias to diode 35 the reactance of this diode can be changed thus providing electronic circuit adjustment. Precise adjustment of the idler circuit consisting of the diode, line section 27, and line section 25 is made by mechanical positioning of plunger 31.

FIG. 3 is a curve showing the input impedance of a compound transmission line as a function of frequency. If the combined lengths of transmission lines 22 and 23*a* and 23b, $L1+L2$ are made equal to one-half wavelength at the desired output frequency *nf*, where *f* is the frequency of the signal applied to the multiplier and *n* is an integer equal to the desired output harmonic, the impedance of the compound transmission line presented to the output harmonic will be zero and the resulting short circuit will prevent the output frequency from flowing in the signal source. By proper selection of the impedance ratio of transmission lines 22 and 23*a* and 23*b*, Z2/Z1, the particular value being dependent upon the ratio of *nf/f*, the compound transmisison line will have a reactance less than some specified value over the frequency range from *f*1 to *f*2 where *f*1 is greater than *f* and *f*2 is greater than *nf*. Thus signals having frequencies between *f*1 and *f*2 will be isolated from the source by the compound transmission which will have a low shunt impedance at these frequencies. A description of the operation and design of a compound transmission line is found in VHF Techniques, vol. 2, Radio Research Laboratory Staff Harvard University, McGraw-Hill, 1947, pages 922 to 925.

The input signal at frequency *f* is coupled to varactor diode 35 through the transmission line sections 22, 23*a* and 23*b*, 25 and 28. The current at the fundamental frequency flowing through varactor diode 35 generates harmonics which are used to develop the desired output frequency.

In order to develop the desired output harmonic it is desirable that certain intermediate frequency currents called idler frequency currents be permitted to flow through the varactor diode, without flowing through the output load or the source. Idler current paths are provided to enable these currents to flow. Three distinct idler current paths are provided by this arrangement of the transmission line sections. These paths are the transmission line section 28 plus the transmission line section 27, the transmission line sections 28, 25 and 23*a* and 23*b*, and the transmission line sections 28, 38 and 29. These paths provide idler paths by virtue of the reflective terminations provided by the short circuited end of transmission line section 27, the short circuited end of transmission line sections 23*a* and 23*b* and the input terminals of output filter 36. Each of these paths can be adjusted to resonate with the diode reactance at a different harmonic frequency and can be used to idle more than one frequency.

In addition to the idler current paths described above the lengths and impedances of the compound transmission line can be altered to allow the lower harmonic frequencies to flow beyond terminals AA. By providing a shunt arm in the input transformer a fourth idler path can be obtained.

The impedances Z3, Z5 and Z6 of transmission line sections 25, 28 and 29 respectively are adjusted to provide optimum separation between the various idler paths and to facilitate transfer of energy at the fundamental drive frequency to the diode and at the output harmonic frequency to the load impedance. The output harmonic frequency is coupled to load impedance 37 through transmission line sections 28, 38 and 29 and output filter 36.

As can be seen from FIG. 3 it is not required that *nf* be the design center of the compound line section. With a frequency multiplier having large output harmonic ratios, 10 or greater, it may be desirable to make the length of the compound transmission line sections 22 and 23*a* and 23*b*, $L1+L2$, a half wavelength at a frequency greater than *nf*. This would provide idler current paths at higher harmonic frequencies than would be obtainable if $L1+L2$ were made one-half wavelength at frequency *nf* and would also present a low shunt impedance to isolate the source from the output harmonic frequency *nf*.

In a frequency multiplier of this type it is required that the tuning stub have a negligible affect on the fundamental and output frequencies while providing a low impedance path for the idler frequency. In certain combinations of idler and output frequencies it is difficult to meet these requirements using a short circuited stub tuner. In these cases the use of an open circuited stub tuner will provide the desired idler path without affecting the fundamental or output harmonics.

Figure 5:
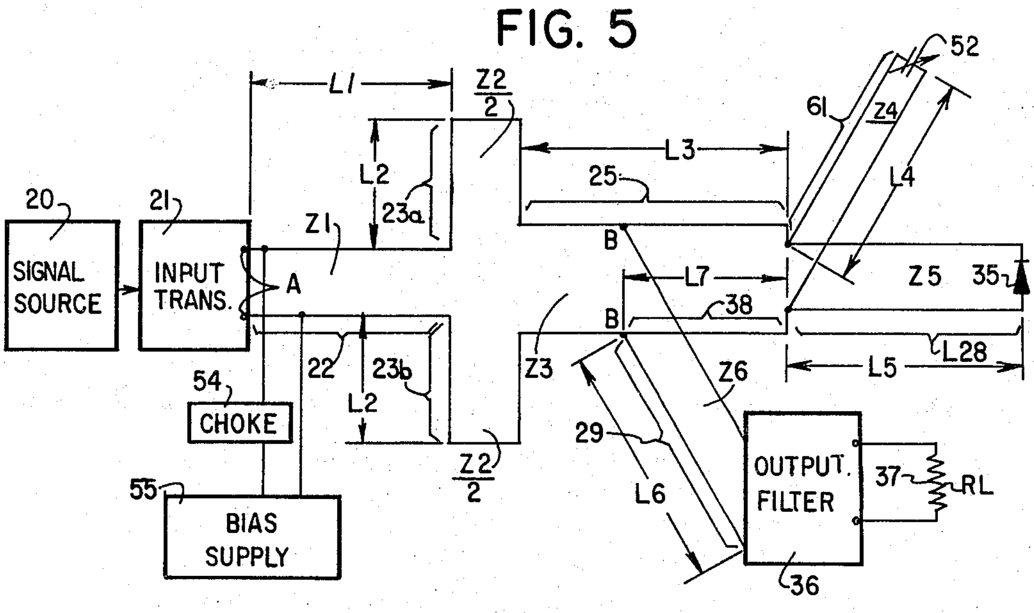
FIG. 5 is a schematic diagram of the circuit illustrated in FIG. 4.
Figure 4:
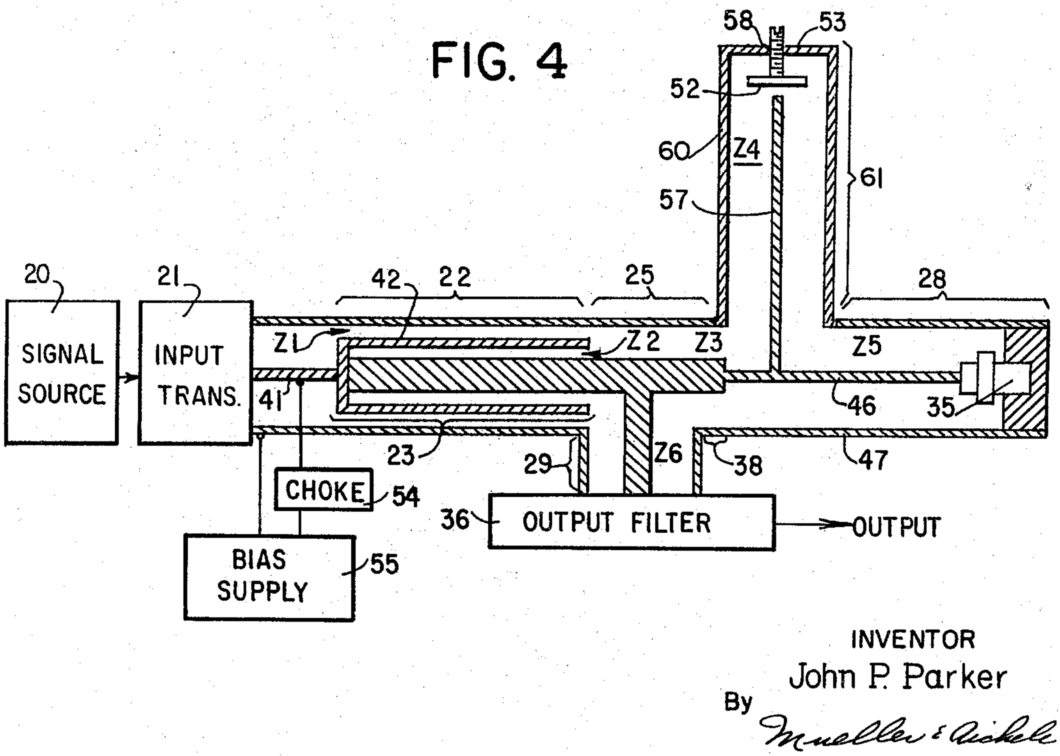
FIG. 4 is a cross-sectional view of a second embodiment of the invention.

FIG. 4 is a cross-sectional view of another embodiment of this invention in which the short circuited stub tuner 27 of FIG. 1 is replaced by an open circuited stub tuner 61 to provide an idler path for harmonic and idler frequency combinations where a short circuited stub tuner cannot be used. A schematic representation of the open circuited stub tuner 61 is shown in FIG. 5. Portions of the two embodiments which are the same have the same numbers. The sliding plunger 31 of FIG. 1 has been removed and an end portion 53 is provided to enclose the outer conductor 60 of the open circuited stub tuner to prevent radiation loss from the open circuited stub. A capacitor is formed by plate 52 and center conductor 57. Plate 52 is attached to a threaded shaft 58 which engages threads in end wall 53. Tuning shaft 58 changes the spacing between plate 52 and center conductor 57 and thus the capacitance of the tuner. The electrical length of the stub, and thus the idler frequency of the stub tuner is effectively changed by the adjustment of this capacitor. Varactor diode 35 is biased by a current from bias supply 55 coupled to the transmission line structure through choke 54.

Thus a simple transmission line structure has been provided which effectively couples a fundamental input frequency to a varactor diode for generating harmonics of the fundamental frequency. The transmission line structure provides paths for the circulation of idler currents. An output filter prevents the fundamental and idler harmonic frequencies from flowing in the load. A tuning stub and a compound transmission line structure are incorporated to provide paths for the circulation of idler currents and to isolate the source impedance from the harmonics generated by the varactor diode.

I claim:

1. A frequency multiplier including in combination, input means adapted to receive alternating current signals at a fundamental frequency, output filter means adapted to be coupled to a load, a varactor diode, compound transmission line means coupled to said input means, first transmission line means having first, second and third portions coupling said compound transmission line to said varactor diode, said compound transmission line and said first transmission line cooperating to apply said alternating current signals to said varactor diode, second transmission line means coupling said output filter means to the junction of said first and second portions, a variable length shorting stub coupled to the junction of said second and third portions, said diode being responsive to said alternating current signals to generate harmonic signals thereof including idler harmonic signals and an output harmonic signal, said output filter means being responsive to said harmonic signals to couple said output harmonic signal to the load, the length of said shorting stub and said third portion of said first transmission line means being adjusted to provide a first path for a first idler harmonic frequency signal to flow through said varactor diode, said second transmission line means and said second and third portions of said first transmission line means being responsive to a second idler harmonic frequency to provide a second path for a second idler harmonic frequency signal to flow through said diode, said compound transmission line means and said first transmission line means being responsive to a third idler harmonic frequency signal to provide a third path for a third idler harmonic frequency signal to flow through said varactor diode, said compound transmission line further being responsive to said harmonic signals to prevent said harmonic signals from being coupled to said input means.

2. A frequency multiplier including in combination, input means adapted to receive alternating current signals at a fundamental frequency, output filter means adapted to be coupled to a load, a varactor diode, compound transmission line means coupled to said input means, first transmission line means having first, second and third portions coupling said compound transmission line means to said varactor diode, said compound transmission line and said first transmission line cooperating to apply said alternating current signals to said varactor diode, second transmission line means coupling said output filter means to the junction of said first and second portions, a variable length shorting stub coupled to the junction of said second and third portions, said diode being responsive to said alternating current signals to generate harmonic signals thereof including an output harmonic signal and first and second bands of idler harmonic signals, said first band being higher in frequency than said second band, said output filter means being responsive to said harmonic signals to couple said output harmonic signal to the load, the length of said shorting stub and said third portion of said first transmission line means being adjusted to provide a first path for a first idler harmonic frequency signal to flow through said varactor diode, said second transmission line means and said second and third portions of said first transmission line means being responsive to a second idler harmonic frequency to provide a second path for a second idler harmonic frequency signal to flow through said diode, said compound transmission line means and said first transmission line means being responsive to a third idler harmonic signal to provide a third path for a third idler harmonic frequency signal to flow through said varactor diode, said compound transmission line means further being responsive to said first and second bands of idler harmonic signals to prevent said idler harmonic signals of said first band from being coupled to said source and to couple said idler harmonic signals of said second band to said input means, shunt means coupled to said input means to provide a fourth path for a fourth idler harmonic frequency signal to flow through said diode.

3. A frequency multiplier for generating an output harmonic frequency of an alternating current signal applied thereto, the frequency multiplier including in combination, a varactor diode, a first coaxial transmission line having inner and outer conductors, means for applying alternating current signals to said first transmission line, a second coaxial transmission line having inner and outer conductors coupling said first coaxial transmission line to said varactor diode, said diode being connected between said inner and outer conductors of said second coaxial transmission line, a tuning stub having inner and outer conductors coupled to said second coaxial transmission line between said diode and said first coaxial transmission line, shorting means coupling said inner conductor to said outer conductor of said tuning stub for adjusting the electrical length thereof, output means including a filter responsive to the output frequency coupled to said second coaxial transmission line, a cylindrical sleeve having a closed end and an open end, said sleeve being positioned between said inner and outer conductors of said first coaxial transmission line, said open end of said sleeve facing said second transmission line, said closed end of said sleeve being connected to said inner conductor of said first transmission line, said sleeve and said first transmission line cooperating to form a compound transmission line.

4. A frequency multiplier including in combination, input means adapted to receive alternating current signals at a fundamental frequency, output filter means adapted to be coupled to a load, a varactor diode, compound transmission line means coupled to said input means, first transmission line means coupling said compound transmission line means to said varactor diode, said compound transmission line and said first transmission line cooperating to apply said alternating current signals to said varactor diode, second transmission line means coupling said output filter means to said first transmission line means, an open circuited tuning stub having a variable electrical length coupled to said first transmission line means, said diode being responsive to said alternating current signals to generate harmonic signals thereof including idler harmonic signals and an output harmonic signal, said output filter means being responsive to said harmonic signals to couple said output harmonic signal to the load, the electrical length of said open circuited tuning stub being adjusted to provide a first path for a first idler harmonic frequency signal to flow through said varactor diode, said compound transmission line being responsive to said harmonic signals to prevent said harmonic signals from being coupled to said input means and to provide a second path for a second idler harmonic frequency signal to flow through said varactor diode.

5. A frequency multiplier including in combination, input means adapted to receive alternating current signals at a fundamental frequency, output filter means adapted to be coupled to a load, a varactor diode, compound transmission line means coupled to said input means, first transmission line means having first, second and third portions coupling said compound transmission line to said varactor diode, said compound transmission line and said first transmission line cooperating to apply said alternating current signals to said varactor diode, second transmission line means coupling said output filter means to the junction of said first and second portions, an open circuited tuning stub having a variable electrical length coupled to the junction of said second and third portions, said diode being responsive to said alternating current signals to generate harmonic signals thereof including idler harmonic signals and an output harmonic signal, said output filter means being responsive to said harmonic signals to couple said output harmonic signal to the load, the length of said open circuited tuning stub and said third portion of said first transmission line means being adjusted to provide a first path for a first idler harmonic frequency signal to flow through said varactor diode, said second transmission line means and said second and third portions of said first transmission line means being responsive to a second idler harmonic frequency to provide a second path for a second idler harmonic frequency signal to flow through said diode, said compound transmission line means and said first transmission line means being responsive to a third idler harmonic frequency signal to provide a third path for a third idler harmonic frequency signal to flow through said varactor diode, said compound transmission line further being responsive to said harmonic signals to prevent said harmonic signals from being coupled to said input means.

6. A frequency multiplier including in combination, input means adapted to receive alternating current signals at a fundamental frequency, output filter means adapted to be coupled to a load, a varactor diode, compound transmission line means coupled to said input means, first transmission line means having first, second and third portions coupling said compound transmission line means to said varactor diode, said compound transmission line and said first transmission line cooperating to apply said alternating current signals to said varactor diode, second transmission line means coupling said output filter means to the junction of said first and second portions, an open circuited tuning stub having a variable electrical length coupled to the junction of said second and third portions, said diode being responsive to said alternating current signals to generate harmonic signals thereof including an output harmonic signal and first and second bands of idler harmonic signals, said first band being higher in frequency than said second band, said output filter means being responsive to said harmonic signals to couple said output harmonic signal to the load, the electrical length of said open circuited tuning stub and said third portion of said first transmission line means being adjusted to provide a first path for a first idler harmonic frequency signal to flow through said varactor diode, said second transmission line means and said second and third portions of said first transmission line means being responsive to a second idler harmonic frequency to provide a second path for a second idler harmonic frequency signal to flow through said diode, said compound transmission line means and said first transmission line means being responsive to a third idler harmonic signal to provide a third path for a third idler harmonic frequency signal to flow through said varactor diode, said compound transmission line means further eing responsive to said first and second bands of idler harmonic signals to prevent said idler harmonic signals of said first band from being coupled to said source and to couple said idler harmonic signals of said second band to said input means, shunt means coupled to said input means to provide a fourth path for a fourth idler harmonic frequency signal to flow through said diode.

7. A frequency multiplier for generating an output harmonic frequency of an alternating current signal applied thereto, the frequency multiplier including in combination, a varactor diode, a first coaxial transmission line having inner and outer conductors, means for applying alternating current signals to said first transmission line, a second coaxial transmission line having inner and outer conductors coupling said first coaxial transmission line to said varactor diode, said diode being connected between said inner and outer conductors of said second coaxial transmission line, a tuning stub having inner and outer conductors coupled to said second coaxial transmission line between said diode and said first coaxial transmission line, capacitor means coupling said inner conductor to said outer conductor of said tuning stub for adjusting the electrical length thereof, output means including a filter responsive to the output frequency coupled to said second coaxial transmission line, a cylindrical sleeve having a closed and an open end, said sleeve being positioned between said inner and outer conductors of said first coaxial transmission line, said open end of said sleeve facing said second transmission line, said closed end of said sleeve being connected to said inner conductor of said first transmission line, said sleeve and said first transmission line cooperating to form a compound transmission line.

References Cited

UNITED STATES PATENTS

| | | | |
|---|---|---|---|
| 2,408,420 | 10/1946 | Ginzton | 321—60 |
| 3,025,448 | 3/1962 | Muchmore | 321—69 |
| 3,085,205 | 4/1963 | Sante | 328—16 |
| 3,165,690 | 1/1965 | Kaufman | 321—69 |

JOHN F. COUCH, *Primary Examiner.*

G. GOLDBERG, *Assistant Examiner.*